(12) United States Patent
Kanoh et al.

(10) Patent No.: US 7,381,285 B2
(45) Date of Patent: Jun. 3, 2008

(54) MANUFACTURING METHOD OF A DEVICE

(75) Inventors: Hiroshi Kanoh, Tokyo (JP); Kazushige Takechi, Tokyo (JP); Narumoto Uesaka, Tokyo (JP); Kazuo Nikami, Tokyo (JP)

(73) Assignees: NEC Corporation, Tokyo (JP); Nagase & Co., Ltd., Osakai-shi, Osaka (JP); Sanwa Frost Industry Co., Ltd., Tokyo (JP)

( * ) Notice: Subject to any disclaimer, the term of this patent is extended or adjusted under 35 U.S.C. 154(b) by 0 days.

(21) Appl. No.: 11/105,576

(22) Filed: Apr. 14, 2005

(65) Prior Publication Data
US 2005/0236091 A1 Oct. 27, 2005

(30) Foreign Application Priority Data
Apr. 15, 2004 (JP) .............................. 2004-119856

(51) Int. Cl.
*B32B 37/14* (2006.01)
*B32B 38/10* (2006.01)
*B32B 37/06* (2006.01)
*H01L 21/304* (2006.01)
*B32B 37/10* (2006.01)
*H01L 21/76* (2006.01)

(52) U.S. Cl. .................. 156/247; 156/250; 156/272.2; 430/313; 430/314; 438/458; 438/459; 438/460

(58) Field of Classification Search ................. 428/1.1; 438/458, 460, 459; 156/247, 250, 345.1, 156/272.2; 430/313, 314
See application file for complete search history.

(56) References Cited

U.S. PATENT DOCUMENTS

| 3,761,782 | A | * | 9/1973 | Youmans ..................... 257/778 |
| 3,849,226 | A | * | 11/1974 | Butz .......................... 156/247 |
| 5,294,278 | A | * | 3/1994 | Matsui et al. ............... 156/248 |
| 5,300,172 | A | * | 4/1994 | Ishiwata et al. ......... 156/275.5 |
| 5,403,424 | A | * | 4/1995 | Ehrat et al. ................. 156/247 |
| 6,214,733 | B1 | * | 4/2001 | Sickmiller .................. 438/691 |
| 6,642,126 | B2 | * | 11/2003 | Igel ............................ 438/460 |

FOREIGN PATENT DOCUMENTS

| JP | 9-312349 | | 12/1997 |
| JP | 11-212116 | | 8/1999 |
| JP | 2001-51296 | | 2/2001 |
| JP | 2001051296 | A * | 2/2001 |

* cited by examiner

*Primary Examiner*—Philip C. Tucker
*Assistant Examiner*—Sonya Mazumdar
(74) *Attorney, Agent, or Firm*—McGinn IP Law Group, PLLC

(57) ABSTRACT

In a manufacturing method of a flexible device, when a protective material is adhered onto a surface of a substrate, the adhesion is performed at only a part of the substrate. Since being adhered to the part of the substrate, the protective material is easily peeled away. As a result, the time required for peeling can be decreased, and cracking of the device which may occur in peeling can be prevented.

20 Claims, 6 Drawing Sheets

MANUFACTURING METHOD OF A DEVICE

This application claims priority to prior Japanese patent application JP 2004-119856, the disclosure of which is incorporated herein by reference.

BACKGROUND OF THE INVENTION

The present invention relates to a manufacturing method of a device. In more particular, the present Invention relates to the manufacturing method of a flexible device by decreasing the thickness of an insulating substrate, such as a glass substrate, and then adhering a support body such as a film onto the insulating substrate, followed by transfer of the device.

In recent years, flexible devices which are light weight and hard to crack have been increasingly required. For example, development of a flexible liquid crystal display device using a resin substrate has been progressively advanced for manufacturing a thin-film transistor liquid crystal display device. As a method for realizing the display device described above, a device manufacturing method has been already developed in which a thin-film transistor array once formed on a glass substrate is transferred to a resin substrate. For example, as the device manufacturing method described above, a method may be mentioned having the steps of wet-etching a glass substrate which has a thin-film transistor array formed thereon from a rear surface side of the glass substrate using an HF-based etching solution so that the entire glass is removed, and then adhering a resin substrate onto the above array at the etched surface side so as to form a flexible thin-film transistor array substrate (disclosed in Society for Information Display 2002 by SONY Corp).

A related process will be described with reference to FIGS. 7A to 7D, A glass substrate 14 has an etching stopper 12 and a thin-film transistor array 13 in that order on the surface thereof, A protective sheet 15 is adhered over the entire surface of the glass substrate 14 with an adhesive provided therebetween (FIG. 7A). Subsequently, the entire glass substrate is etched away from the rear surface side thereof using an HF-based etching solution 16, and the etching is stopped by the etching stopper 12 (FIG. 7B). A resin substrate 17 is adhered onto the etching stopper 12 at the etched surface side (FIG. 7C). Finally, the protective sheet 15 is peeled away, so that the transfer of the thin-film transistor array 13 is completed (FIG. 7D). Alternatively, as disclosed in Japanese Unexamined Patent Application Publication No. 11-212116, a method may be used in which the entire glass substrate is removed by a chemical polishing method instead of wet etching, followed by transfer of a thin-film transistor array to a resin substrate.

In addition, another method may also be mentioned in which a peeling layer is used instead of the etching stopper 12 shown in FIG. 7A. In the method described above, unlike the step shown in FIG. 7B, the glass substrate is not etched at all. For example, in Japanese Unexamined Patent Application Publication No. 2001-051296, an amorphous silicon layer is used as the peeling layer and is then irradiated with ultraviolet rays from a rear side surface of a glass substrate, and subsequently, the glass substrate is removed from a thin-film transistor array using the abrasion of the amorphous silicon layer. By the method described above, the transfer of the device can also be performed.

As another example of a light-weight thin film device as described above, technical development for realizing a thin IC chip has been carried out by using a method for grinding/polishing a rear surface side of a silicon wafer. For example, in Japanese Unexamined Patent Application Publication No. 9-312349, a method has been disclosed in which a silicon wafer having a semiconductor IC chip formed thereon is ground from the rear surface side, followed by transfer of the semiconductor IC chip onto a flexible resin sheet.

In the related transfer method described above, for manufacturing a flexible liquid crystal display device, after the entire glass substrate having a thin-film transistor array formed thereon is etched or polished away from the rear surface side of the substrate, the thin-film transistor array is then transferred to a resin substrate. According to this related transfer method, in the step of peeling away the protective sheet shown in FIG. 7D, in order to desirably transfer the thin-film transistor array onto the resin substrate side, peeling must be carefully performed using a long time, and as a result, the throughput is considerably decreased. In addition, after the protective sheet is peeled away, adhesive residues are allowed to remain at a thin-film transistor array portion and degrade the stability of transistor electrical characteristic, resulting in decrease in production yield. The problems described above also occur in the case in which the glass substrate is peeled away by using the peeling layer, followed by the transfer.

Furthermore, according to Japanese Unexamined Patent Application Publication No. 9-312349, the step of peeling the semiconductor IC chip from the silicon wafer and the step of transferring the IC chip to the flexible resin sheet both have a low production yield, and as a result, the manufacturing cost is inevitably increased. In addition, the application of the IC chip is limited since the IC chip has a thickness of approximately several tens micrometers and is not transparent, and since element isolation of active elements (such as transistors) is very complicated, a high-voltage element and a low-voltage element are difficult to be mounted on the same substrate.

SUMMARY OF THE INVENTION

Accordingly, an object of the present invention is to provide manufacturing method of a device, in which a thin film device can be manufactured at low cost and can also be manufactured at a high throughput with a high production yield.

In order to achieve the above object, manufacturing method of a device, according to the present invention, comprises: forming a device on a surface of a substrate; adhering a protective material onto the surface of the substrate for covering; grinding the substrate from a rear surface thereof; adhering a support body onto the ground rear surface of the substrate; and peeling away the protective material. In the method described above, in the step of adhering the protective material onto the surface of the substrate, the protective material is adhered onto only a part of the substrate.

In the manufacturing method of a device, according to the present invention, the part of the substrate onto which the protective material is adhered is preferably in a region other than that in which the thin film device is formed. That is, in adhering the protective material onto the surface of the substrate having the thin-film device formed thereon, in the region onto which the protective material is to be adhered, the thin film device is not present. Hence, after the protective material is finally peeled away, no adhesive residues are allows to remain in a region (hereinafter referred to as "thin-film device region") in which the thin film device is present, and as a result, the stability in performance of the thin film device can be maintained.

In the above manufacturing method of a device, as the protective material, a protective film may be used. In the step of grinding the substrate from the rear surface side, etching or grinding/polishing may be used. In the step of peeling away the protective material, the adhesion strength of the adhesive may be decreased, for example, by light irradiation, heating, or cooling, or a part of the substrate to which the protective material is adhered may be cut away.

The manufacturing method of a device, according to the present invention, is effectively used when a thin-film transistor device formed on a transparent insulating substrate such as a glass is transferred to a flexible substrate or the like.

When a thin-film device assembly is formed by the manufacturing method of a device, according to the present invention, the following advantages can be obtained.

Since an adhesion portion present between the protective material and the surface (hereinafter referred to as "device side surface") of the substrate having the device formed thereon is located only at a part of the substrate, the adhesive is not provided in the thin-film device region, and hence adhesive residues are not allowed to remain therein. On the contrary, in the related process shown in FIGS. 7A to 7D, adhesive residues on the order of several tens ppb are generally allowed to remain in the thin-film device region. The adhesive residues as described above cannot be sufficiently removed even in a washing step, and as a result, the reliability of the thin film device electrical characteristic is disadvantageously degraded. However, according to the present invention, no adhesive residues are allowed to remain in the thin-film device region, and as a result, superior reliability in the electrical characteristic of the thin-film transistor array or the like can be obtained.

In addition, since the adhesion portion is located only at the part of the substrate, peeling of the protective material can be performed within 2 minutes per substrate. In the related process described above, since the time required for this peeling is approximately 10 minutes to one hour, the throughput of the transfer process can be significantly increased by the method according to the present invention. Furthermore, in the present invention, since the adhesion portion is located only at the part of the substrate, and hence the peeling can be easily performed, cracking which may occur in peeling can be prevented, thereby remarkably improving the production yield.

As thus has been described, according to the present invention, a manufacturing method of a device can be obtained in which a thin-film device having superior performance is manufactured at a low cost and a high throughput with a high production yield.

DESCRIPTION OF THE PREFERRED EMBODIMENTS

Embodiments of the present invention will be described with reference to figures.

Figure 1A:
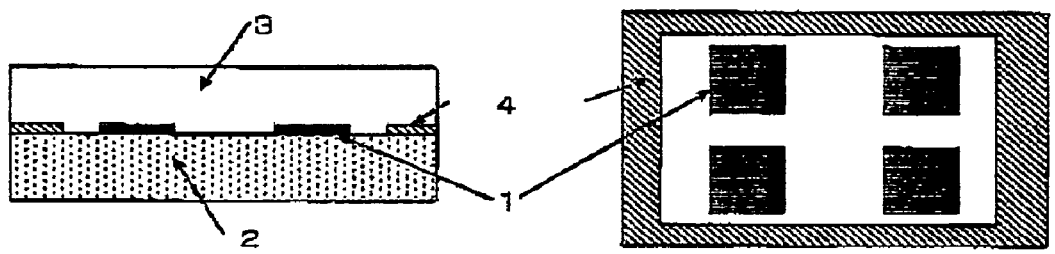
FIGS. 1A to 1D are schematic views showing a manufacturing method according to a first embodiment of the present invention.

FIGS. 1A to 1D are schematic views showing a manufacturing method of an electronic device of a first embodiment according the present invention. As shown in FIG. 1A, onto a device side surface (front surface) of an insulating substrate 2 having thin-film devices 1 formed thereon, a protective material 3 is adhered with an adhesive 4 provided therebetween. In this case, in a region in which the adhesive 4 is present, the thin-film devices 1 are not present. That is, the insulating substrate 2 and the protective material 3 are partly adhered to each other with the adhesive provided therebetween. In the case shown in FIG. 1A, as shown in a plan view on the right side, since the thin-film devices 1 are formed in a central region of the substrate, the protective material 3 and the substrate 2 are adhered to each other only along a peripheral region of the substrate 2 with the adhesive 4.

Figure 1B:
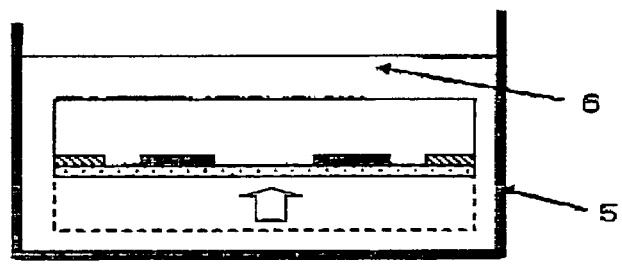
Figure 1C:
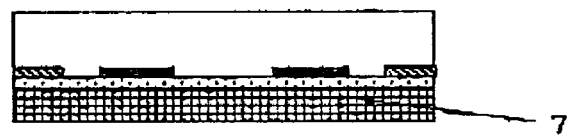
Figure 1D:
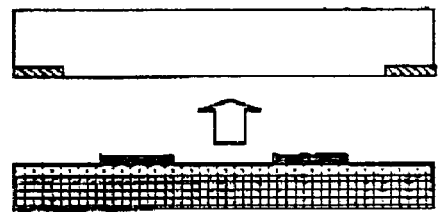

Next, as shown in FIG. 1B, an etching solution 6 is placed in an etching bath 5, and the substrate 2 shown in FIG. 1A is immersed from a rear surface side thereof into the etching bath 5. Since the peripheral region of the substrate 2 is adhered to the protective material 3 using the adhesive 4, etching can be performed while the etching solution 6 is being prevented from entering the thin-film device region. In this step, the entire substrate 2 may be etched away, or the substrate 2 may be partly etched. Furthermore, as shown in FIG. 1C, a support body 7 is adhered onto the etched surface of the substrate 2. Finally, as shown in FIG. 1D, by peeling the protective material 3 adhered to the device side surface (front surface) of the substrate 2, the transfer is completed. In this step, since being adhered only to the part (corresponding to the peripheral region of the substrate 2 in this embodiment) of the substrate 2 with the adhesive 4 provided therebetween, the protective material 3 can be very easily peeled away.

Figure 2A:
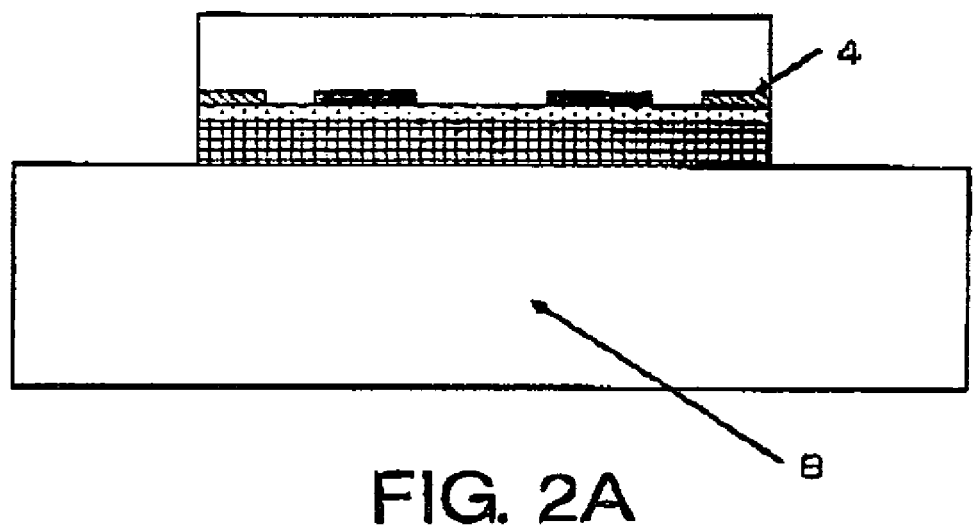
FIGS. 2A and 2B are schematic views showing a manufacturing method according to a second embodiment of the present invention.
Figure 2B:
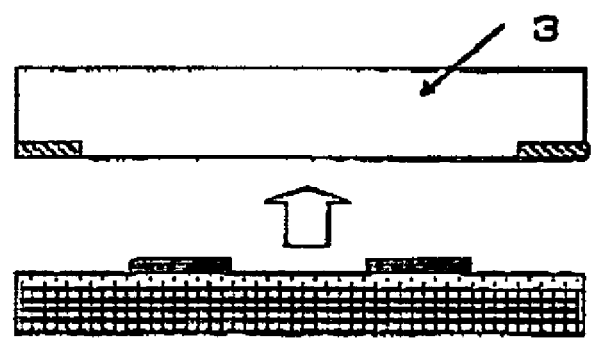

FIGS. 2A and 2B are schematic views showing a manufacturing method of an electronic device, according to a second embodiment of the present invention. In this embodiment, one example of the method for peeling the protective material shown in FIG. 1D will be described. The substrate 2 processed by the steps until the step shown in FIG. 1C is placed on a heating element 8 as shown in FIG. 2A. The temperature of the heating element 8 is appropriately controlled so as to decrease the adhesion strength of the adhesive 4, and subsequently, as shown in FIG. 2B, the protective material 3 is peeled away. Since the adhesion strength of the adhesive 4 is decreased, the protective material 3 can be very easily peeled away.

Figure 3A:
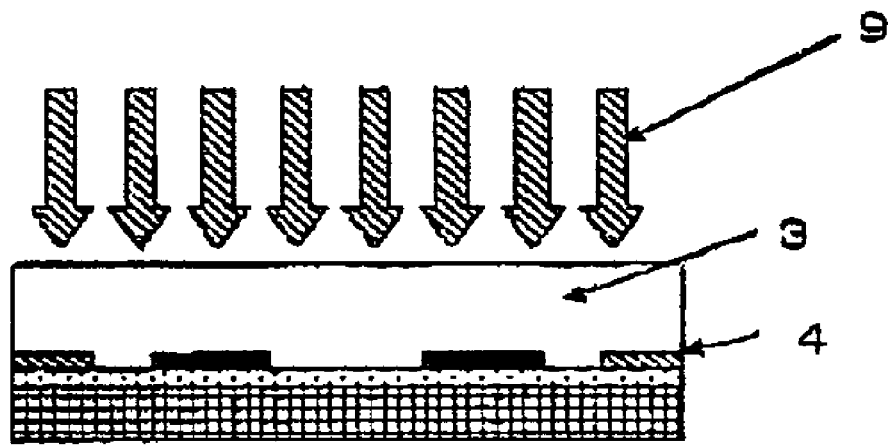
FIGS. 3A and 3B are schematic views showing a manufacturing method according to a third embodiment of the present invention.
Figure 3B:
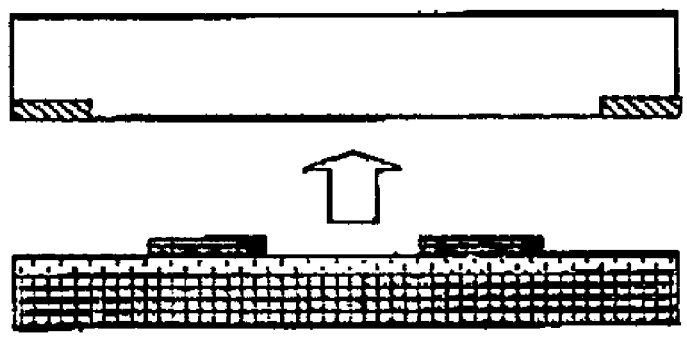

FIGS. 3A and 3B are schematic views showing a manufacturing method of an electronic device, according to a third embodiment of the present invention. In this embodiment, another example of the method for peeling the protective material shown in FIG. 1D will be described. The substrate 2 processed by the steps until the step shown in FIG. 1C is irradiated with light 9 from the upper surface side of the protective material 3 as shown in FIG. 3A. The wavelength of the light 9, such as ultraviolet light or visible light, is appropriately controlled so as to decrease the adhesion strength of the adhesive 4, and subsequently, as shown in FIG. 3B, the protective material 3 is peeled away. Since the adhesion strength of the adhesive 4 is decreased, the protective material 3 can be very easily peeled away.

Figure 4A:
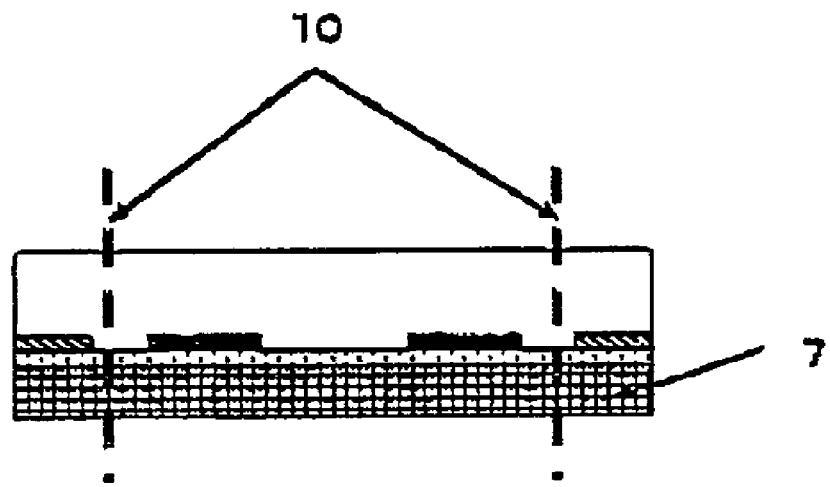
FIGS. 4A and 4B are schematic views showing a manufacturing method according to a fourth embodiment of the present invention.
Figure 4B:
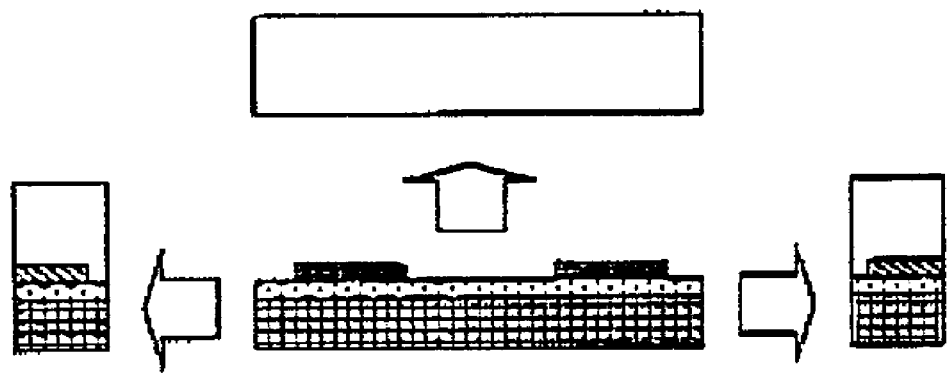

FIGS. 4A and 4B are schematic views showing a manufacturing method of an electronic device, according to a fourth embodiment of the present invention. In this embodiment, another example of the method for peeling the protective material shown in FIG. 1D will be described. The substrate 2 processed by the steps until the step shown in FIG. 1C is cut along cutting lines 10 as shown in FIG. 4A so as to remove a peripheral adhesion portion. In this case, the cutting is performed for the four sides of the periphery of the substrate 2. Subsequently, as shown in FIG. 4B, when the peripheral region of the substrate 2 along the four sides thereof is separated from the central region of the substrate, since the adhesive 4 is not present in the remaining thin-film device region, the protective material 3 can be very easily peeled away.

Figure 5A:
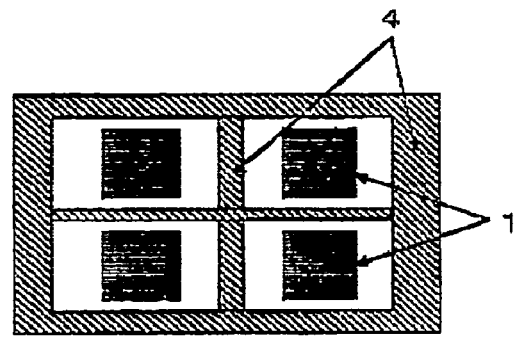
FIGS. 5A to 5C are schematic views showing a manufacturing method according to a fifth embodiment of the present invention.
Figure 5B:
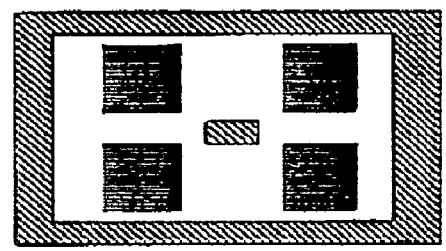
Figure 5C:
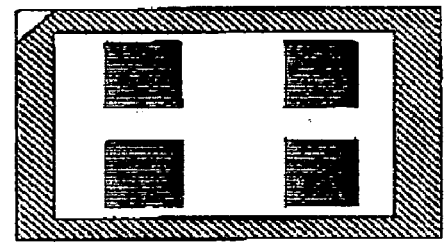

FIGS. 5A to 5C are schematic views showing a manufacturing method of an electronic device, according to a fifth embodiment of the present invention. In this embodiment, another example of the method for adhering the protective material onto the substrate shown in FIG. 1A will be described. In FIG. 5A, besides the adhesion portion provided in the peripheral region of the substrate 2, an adhesion portion having a cross shape is provided. In addition, a plurality of cross-shaped adhesion portions each similar to that described above may also be provided. In FIG. 5B, the case is shown by way of example in which an adhesion portion is provided in the central region besides that provided in the peripheral region of the substrate 2. Furthermore, in FIG. 5C, a non-adhesion portion is provided at a part of the peripheral region (in the case shown in this figure, the part is a corner portion). When the structure is formed as described above, in particular, the protective material 3 can be very easily peeled away from the corner portion described above.

Figure 6:
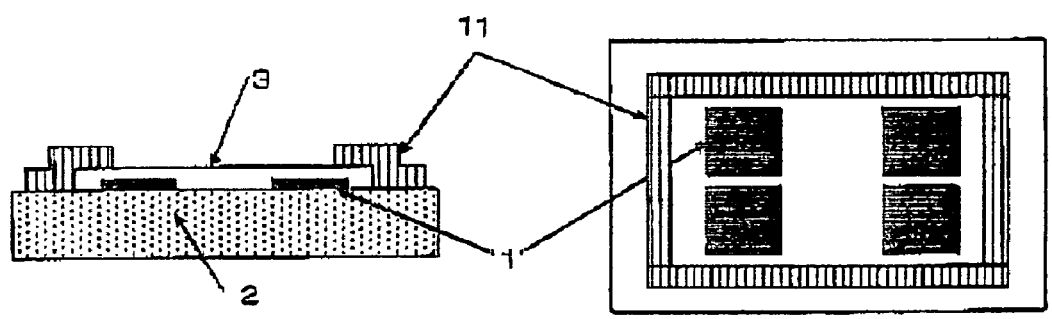
FIG. 6 is a schematic view showing a manufacturing method according to a sixth embodiment of the present invention.
Figure 7A:
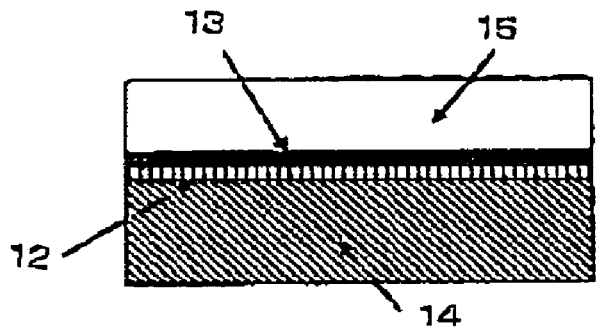
FIGS. 7A to 7D are schematic views showing one example of a related manufacturing method.
Figure 7B:
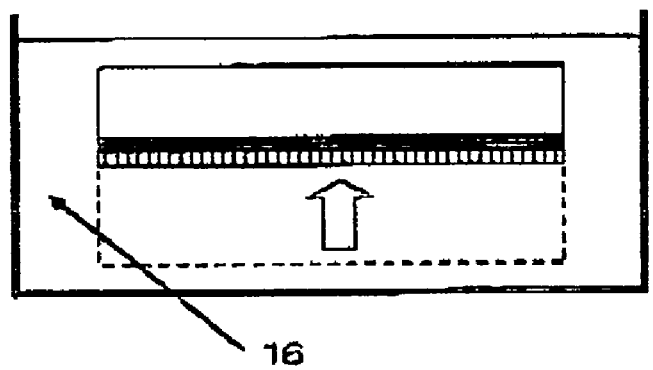
Figure 7C:
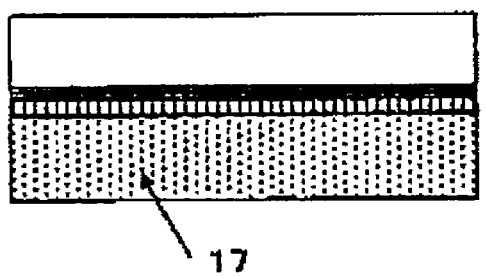
Figure 7D:
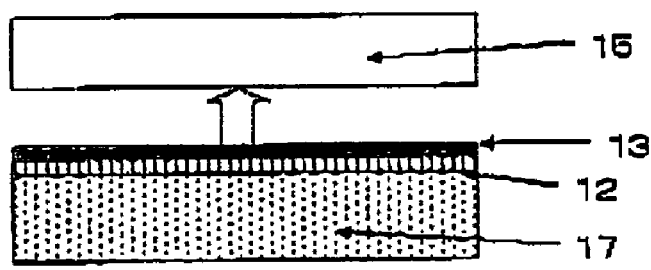

According to all the embodiments described above, the protective material and the device side surface of the substrate for the thin-film device are adhered to each other with the adhesive provided therebetween. In addition to those described above, as a sixth embodiment of the present invention, as shown in FIG. 6, the peripheral region of the protective material and the device side surface of the substrate can be adhered to each other using a tape. In this case, the adhesive is not present between the protective material and the device side surface of the substrate for the thin-film device.

Besides the cases shown in FIGS. 5A, 5B, 5C and 6, by using various methods, the protective material may be adhered onto an optional region of the substrate in which thin-film devices are not present. After the adhesion was performed by the above various methods, methods similar to those shown in FIGS. 2A to 4B may be used so as to peel away the protective material.

Next, specific examples of the present invention will be described.

EXAMPLE 1

Example 1 will be described with reference to FIGS. 1A to 2B. In FIG. 1A, the state is shown in which the device side surface of the insulating substrate having the devices formed thereon and the protective material were adhered to each other. The thin-film devices 1 were each a silicon thin-film transistor array, the insulating substrate 2 was a glass substrate having a thickness of 0.7 mm, the protective material 3 was a film primarily composed of polyethylene-terephthalate (PET) having a thickness of 100 μm, and the adhesive 4 was composed of an acrylic resin. In a picture frame region which was a region from the periphery along the four sides of the substrate to a line located at a distance of 1 cm apart therefrom, the glass substrate and the PET film were adhered to each other with the adhesive provided therebetween. As shown in the plan view at the right side in FIG. 1A, the thin-film devices were formed in the central region of the substrate, and the adhesive was provided only in the peripheral region of the substrate. Only in the region along the periphery of the substrate, the protective material and the substrate were adhered to each other.

Subsequently, in decreasing the thickness of the substrate shown in FIG. 1B, by using a mixed solution of hydrofluoric acid and hydrochloric acid or nitric acid as the etching solution 6, the glass substrate was etched from the rear surface side. The glass substrate was allowed to remain so as to have a thickness of 20 to 100 μm. In this step, the etching rate was approximately 7 μm/minute. As the etching solution, for example, a buffered hydrofluoric acid or a mixed solution of hydrofluoric acid and sulfuric acid may also be used. The PET film has resistance against the etching solution mentioned above, and hence any problems may not arise at all. On the other hand, for the protective material, a material having resistance against a hydrofluoric acid-based etching solution must be selected. In this example, although the PET film was used, for example, polyether sulfone (PES) or polyether ether ketone (PEEK) may also be used.

Next, in providing the support body shown in FIG. 1C, a PES film having a thickness of 100 μm was adhered onto the etched surface of the substrate. Since the support body is not required to have resistance against hydrofluoric acid, as the support body, a metal foil composed, for example, of copper or aluminum may be used besides a resin material such as a polyimide, a polycarbonate, or a polypropylene. Furthermore, for example, a laminate formed of a resin material and a metal foil may also be used.

Peeling between the substrate and the protective material was performed using the heating element shown in FIG. 2A. The substrate processed by the steps until the step shown in FIG. 1C was placed on the heating element 8 as shown in FIG. 2A. The temperature of the heating element 8 was appropriately controlled so as to degrade the adhesion strength of the adhesive 4, and the protective material 3 was then peeled away as shown in FIG. 2B. Since the adhesion strength of the adhesive was degraded, the protective material could be very easily peeled away.

In this example, when the protective material is adhered onto the device surface of the substrate, the adhesion is performed using only a part of the substrate. In particular, when the adhesion is performed only in the region in which the thin-film device is not present, peeling can be performed without causing any adhesive residues. In addition, since the adhesion portion is only the part of the substrate, the protective material can be peeled away within 2 minutes per substrate. Since the time required for this peeling is approximately 10 minutes to one hour in the related process described above, the throughput of the transfer process can be significantly increased by the method according to the present invention. Furthermore, in the present invention, since the adhesion portion is only the part of the substrate, and hence the peeling can be easily performed, cracking which may occur in peeling can be prevented, thereby remarkably improving the production yield. According to this example, a manufacturing method of a device can be obtained which is highly reliably performed with a high production yield.

EXAMPLE 2

In FIGS. 2A and 2B, Example 2 corresponding to the second embodiment is shown. Example 2 is an example in which the peeling between the substrate and the protective material shown in FIG. 1D of Example 1 was performed by controlling the temperature. Since the steps from the adhesion of the protective material to the adhesion of the support body were equivalent to those shown in FIGS. 1A to 1C of Example 1, description thereof will be omitted.

The substrate was provided with a PET film as the protective material as shown in FIG. 1A and was then processed by the steps until the step shown in FIG. 1C. Subsequently, the substrate was placed on the heating element 8 as shown in FIG. 2A. By using a hot plate as the heating element 8 shown in FIG. 2A, the temperature of the substrate was increased to 100° C. Hence, the chemical structure of the adhesive was changed so that the adhesive strength thereof was decreased to one hundredth or less of the initial strength, and as a result, the PET film used as the protective material could be very easily peeled away.

In this case, as the method for controlling the temperature, a hot plate was used; however, as the heating methods, various methods may be performed. For example, a method for placing the substrate in an oven, a method for supplying a hot wind to the substrate, and a method for heating the substrate using an infrared lamp may also be mentioned. In addition, an adhesive may also be used which loses its adhesive strength when being cooled, and in this case, instead of the heating element, a cooling element is to be used. When the heating or cooling is performed as described above, it is necessary that the adhesive strength of an adhesive used for adhering the support body to the substrate be not decreased by the change in temperature.

In this example, since the adhesive is used having the chemical structure which is changed by the change in temperature, and the temperature is controlled, the protective material can be peeled away, and as a result, a manufacturing method of a device can be obtained which is highly reliably performed with a high production yield.

EXAMPLE 3

In FIGS. 3A and 3B, Example 3 corresponding to the third embodiment is shown. Example 3 is an example in which the peeling between the substrate and the protective material shown in FIG. 1D of Example 1 was performed by light irradiation. Since the steps from the adhesion of the protective material to the adhesion of the support body were equivalent to those shown in FIGS. 1A to 1C of Example 1, description thereof will be omitted.

The peeling between the substrate and the protective material shown in FIG. 1D can be performed by light irradiation as shown in FIG. 3A using an adhesive having a chemical structure which is changed when being irradiated with light. As shown in FIG. 1A, an acrylic resin having a chemical structure which was changed when irradiated with ultraviolet light was used as an adhesive, and a PET film was adhered onto the substrate as the protective material. After etching, as the light 9, light was irradiated from a mercury lamp having a strong ultraviolet ray component in the step shown in FIG. 3A. Light having an energy of 1 J/cm$^2$ was irradiated at a wavelength of 200 to 400 nm, and hence the adhesive strength was decreased to one hundredth or less of the initial strength. As a result, as shown in FIG. 3B, the PET film used as the protective material could be very easily peeled away. However, the light is not always limited to ultraviolet light, and an adhesive may be used having a chemical structure which is changed by visible light irradiation. When the peeling is performed by light irradiation as described above, it is necessary that the adhesive strength of an adhesive used for adhering the support body to the substrate be not decreased by the light irradiation.

In this example, the protective material can be peeled away by light irradiation using the adhesive having the chemical structure which is changed by light irradiation, and as a result, a manufacturing method of a device can be obtained which is highly reliably performed with a high production yield.

EXAMPLE 4

In FIGS. 4A and 4B, Example 4 corresponding to the fourth embodiment is shown. Example 4 is an example in which the peeling between the substrate and the protective material shown in FIG. 1D of Example 1 was performed by a cutting method. Since the steps from the adhesion of the protective material to the adhesion of the support body were equivalent to those shown in FIGS. 1A to 1C of Example 1, description thereof will be omitted.

The peeling between the substrate and the protective material shown in FIG. 1D can be easily performed when the adhesion portion was cut away as shown in FIGS. 4A and 4B. In FIG. 1A, as the protective material, a PET film was adhered onto the substrate. In this step, the adhesive provided in the peripheral region was not required to have particular properties (for example, the structure thereof was changed by light or heat), and hence an inexpensive adhesive can be used. After the etching, cutting was performed for the adhesion portion in the peripheral region of the substrate as shown in FIG. 4A, so that the adhesion portion and the region in which the devices were formed were separated from each other. In this case, the cutting was performed for the four sides of the substrate along the periphery thereof. The cutting may be performed, for example, by using a dicing saw or laser cutter. Subsequently, as shown in FIG. 4B, when the four sides of the substrate along the periphery thereof are separated along the cutting lines 10, since the adhesive is not present in the remaining thin-film device region, the PET film can be very easily peeled away.

In this example, the protective material can be peeled away by cutting away the adhesion portion, and as a result, a manufacturing method of a device can be obtained which is highly reliably performed with a high production yield.

EXAMPLE 5

In FIGS. 5A to 5C, Example 5 corresponding to the fifth embodiment is shown. Example 5 is an example in which the method for adhering the protective material onto the device side surface of the substrate shown in FIG. 1A of Example 1 was changed. Since the steps after the adhesion between the protective material and the device side surface of the substrate were equivalent to those shown in FIGS. 1B to 1D of Example 1, description thereof will be omitted.

As the method for partly adhering the protective material onto the device side surface of the substrate with the adhesive provided therebetween, shown in FIG. 1A, for example, 1) a method for applying an adhesive onto a part of a protective material may be used. In addition, although an adhesive is applied onto the entire protective material, there may also be used 2) a method in which a protective material and a substrate are partly adhered to each other at a desired place with a paper or a film Interposed therebetween. In particular, according to the second method described above, for example, when papers or films in conformity with a pattern of a non-adhesion portion are prepared beforehand as shown in FIG. 5A, the adhesion may be efficiently performed.

FIG. 5A is a schematic view showing an adhesion portion having a cross shape provided besides the adhesion portion in the peripheral region of the substrate. A plurality of cross-shaped adhesion portions each similar to that described above may also be provided. In FIG. 5B, the case is shown in which an adhesion portion is provided in the central region besides the adhesion portion provided in the peripheral region of the substrate. Furthermore, in FIG. 5C, the case is shown in which a non-adhesion portion is provided at a part (corner portion in this figure) of the peripheral region. In this case, the protective material can be particularly easily peeled away from this corner portion.

In this example, besides the adhesion portion provided in the peripheral region of the substrate, since the adhesion portion is provided on a part of the surface of the substrate on which the devices are not formed, a manufacturing method of a device can be obtained which is highly reliably performed with a high production yield.

EXAMPLE 6

In FIG. 6, Example 6 corresponding to the sixth embodiment is shown. Example 6 is an example in which the method for adhering the protective material onto the device side surface of the substrate shown in FIG. 1A of Example 1 was changed. Since the steps after the adhesion between the protective material and the device side surface were equivalent to those shown in FIGS. 1B to 1D of Example 1, description thereof will be omitted According to all the examples described above, by providing the adhesive between the protective material and the device side surface of the substrate, the adhesion therebetween was achieved. However, Example 6 is an example in which the peripheral region of the protective material and the surface of the substrate were adhered to each other using a tape as shown in FIG. 6. In this example, no adhesive was present between the protective material and the surface of the thin-film device substrate.

In this example, since the peripheral region of the protective material and the surface of the substrate were adhered to each other using a tape, a manufacturing method of a device can be obtained which is highly reliably performed with a high production yield.

In the examples described above, since the adhesion portion between the device side surface of the substrate and the protective material was provided at a part of the substrate, a manufacturing method of a device can be obtained which is highly reliably performed with a high production yield. The reason for this is that since the adhesive was not provided in the thin-film device region, no adhesive residues were present. In the related process as shown in FIG. 7, adhesive residues on the order of several tens ppb were allowed to remain in the thin-film device region. The residues as described above could not be sufficiently removed even by a washing step, and as a result, the reliability of the thin-film device electrical characteristic was degraded. In the present invention, the adhesive residues are not allowed to remain in the thin-film device region, and hence the electrical characteristic of a thin-film transistor array or the like have superior reliability.

In addition, since the adhesion portion was only a part of the substrate, the protective material could be peeled away within 2 minuets per substrate. In the related process, the time required for peeling was approximately 10 minutes to 1 hour; however, by the present invention, the throughput of the transfer process could be significantly increased.

Furthermore, according to the present invention, since the adhesion portion was only a part of the substrate, and hence the peeling could be easily performed, cracking which might occur in peeling could be prevented, and the production yield could be remarkably improved.

As has thus been described, by using the manufacturing method of a device, according to the present invention, a high performance thin-film device could be manufactured at a low cost, and in addition, manufacturing could be performed at a high throughput with a high production yield.

Heretofore, the present invention has been described in detail with reference to the examples; however, of course, it is to be understood that the present invention is not limited to the examples described above, and that the present invention may be variously modified and changed without departing from the spirit and the scope of the present invention. For example, in addition to the cases shown in FIGS. 1A, 5A, 5B, 5C, and 6, various adhering methods may be performed in which the protective material is adhered to an optional region of the substrate in which the devices are not present. As a material functioning as an adhesive, a sticky material may also be used. In the cases in which the above sticky material is used, the protective material can also be peeled away by a method equivalent to that shown in FIGS. 2A to 4B.

In addition, in the examples, the case has been described in which the film is used as the protective material and the support body; however, in addition to the film, a sheet or a plate having a thickness of approximately several millimeters to several centimeters may also be used. In addition, the process for etching the substrate has been described; however, a method in which mechanical grinding is performed may also be used. Furthermore, the device is not limited to the thin-film transistor array but may also be applied to optional electronic device such as a wiring array and a passive element array.

What is claimed is:

1. A manufacturing method of a device, comprising:
   forming a device on a surface of a substrate;
   adhering a protective material onto the surface of the substrate;
   removing a portion of the substrate from a rear surface thereof; and
   peeling away the protective material,
   wherein, in the adhering of the protective material onto the surface of the substrate, a peripheral region of the protective material is adhered onto a portion of the substrate,
   wherein a non-adhesive portion of the protective material covers the device, and
   wherein the peripheral region of the protective material is adhered onto the surface of the substrate using a tape.
2. The manufacturing method of a device, according to claim 1, wherein, in the adhering of the protective material onto the surface of the substrate, the protective material is adhered onto the surface of the substrate with an adhesive or a sticky material provided therebetween.

3. The manufacturing method of a device, according to claim 1, wherein the portion of the substrate is in a region other than that in which the device is formed.

4. The manufacturing method of a device, according to claim 2, wherein the portion of the substrate is in a region other than that in which the device is formed.

5. The manufacturing method of a device, according to claim 1, wherein the portion of the substrate is in a region other than that in which the device is formed.

6. The manufacturing method of a device, according to claim 1, wherein the protective material comprises a film.

7. The manufacturing method of a device, according to claim 3, wherein the protective material comprises a film.

8. The manufacturing method of a device, according to claim 1, wherein the removing of the substrate from the rear surface thereof comprises one of etching and mechanical grinding.

9. The manufacturing method of a device, according to claim 1, wherein, in the adhering of the protective material onto the surface of the substrate, the protective material is adhered onto the surface of the substrate with an adhesive provided therebetween, and the adhesion strength of the adhesive is decreased by light irradiation, heating, or cooling in the peeling away of the protective material.

10. The manufacturing method of a device, according to claim 1, wherein a portion of the protective material is cut away in the peeling away of the protective material, the portion being adhered to the substrate.

11. The manufacturing method of a device, according to claim 1, wherein the device comprises a thin film transistor formed from silicon.

12. The manufacturing method of a device, according to claim 1, further comprising:
adhering a support body onto a remaining rear surface of the substrate.

13. The manufacturing method of a device, according to claim 1, wherein said non-adhesive portion of the protective material is proximate the peripheral region of the protective material.

14. The manufacturing method of a device, according to claim 1, comprising:
placing said substrate on a heating element,
wherein the temperature of the heating element is controlled so as to decrease the adhesion strength of the adhesion property of the protective material.

15. The manufacturing method of a device, according to claim 1, comprising:
irradiating said substrate with an electromagnetic wavelength,
wherein the irradiating is controlled so as to decrease the adhesion strength of the adhesion property of the protective material.

16. The manufacturing method of a device, according to claim 1, wherein said electromagnetic wavelength comprises one of ultraviolet light and visible light.

17. The manufacturing method of a device, according to claim 1, comprising:
cutting to remove the protective material from the surface of the substrate.

18. The manufacturing method of a device, according to claim 1, wherein, in the adhering of the protective material onto the surface of the substrate, a peripheral region and a central lateral region of the protective material is adhered onto a portion of the substrate.

19. A manufacturing method of a device, comprising:
forming a device on a surface of a substrate;
adhering a protective material onto the surface of the substrate;
removing a portion of the substrate from a rear surface thereof; and
peeling away the protective material,
wherein a peripheral region of the protective material is adhered onto the surface of the substrate using a tape.

20. A manufacturing method of a device, comprising:
forming a device on a surface of a substrate;
adhering a protective material onto the surface of the substrate, said protective material including a non-adhesive portion that covers the device;
removing a portion of the substrate from a rear surface thereof; and
peeling away the protective material,
wherein a peripheral region of the protective material is adhered onto the surface of the substrate using a tape.

* * * * *